(12) United States Patent
Fielden et al.

(10) Patent No.: US 12,072,606 B2
(45) Date of Patent: Aug. 27, 2024

(54) PROTECTIVE COATING FOR NONLINEAR OPTICAL CRYSTAL

(71) Applicant: KLA Corporation, Milpitas, CA (US)

(72) Inventors: John Fielden, Los Altos, CA (US); Yung-Ho Alex Chuang, Cupertino, CA (US)

(73) Assignee: KLA Corporation, Milpitas, CA (US)

( * ) Notice: Subject to any disclaimer, the term of this patent is extended or adjusted under 35 U.S.C. 154(b) by 126 days.

(21) Appl. No.: 17/862,133

(22) Filed: Jul. 11, 2022

(65) Prior Publication Data

US 2023/0034635 A1 Feb. 2, 2023

Related U.S. Application Data

(60) Provisional application No. 63/227,342, filed on Jul. 30, 2021.

(51) Int. Cl.
*G02F 1/355* (2006.01)
*G01N 21/95* (2006.01)
*G03F 7/00* (2006.01)

(52) U.S. Cl.
CPC ....... *G02F 1/3551* (2013.01); *G01N 21/9501* (2013.01); *G03F 7/7015* (2013.01); *G03F 7/70591* (2013.01); *G01N 2201/068* (2013.01)

(58) Field of Classification Search
None
See application file for complete search history.

(56) References Cited

U.S. PATENT DOCUMENTS

| 4,826,283 A | 5/1989 | Chuangtian et al. |
| 5,608,526 A | 3/1997 | Piwonka-Corle et al. |

(Continued)

FOREIGN PATENT DOCUMENTS

| JP | 10062830 A | 3/1998 |
| WO | 2009154745 A2 | 12/2009 |

OTHER PUBLICATIONS

K. Matsumura et al., "Optimization of terahertz wave generation from nonlinear optical crystal using amorphous fluoropolymer coating," 2019 44th International Conference on Infrared, Millimeter, and Terahertz Waves (IRMMW-THz), Paris, France, 2019, pp. 1-2. (Year: 2019).*

(Continued)

*Primary Examiner* — Rhonda S Peace
(74) *Attorney, Agent, or Firm* — Suiter Swantz IP

(57) ABSTRACT

An amorphous layer is used as a protective coating for hygroscopic nonlinear optical crystals. The amorphous layer consists of one or more alkali metal borates and/or alkali earth metal borates. The amorphous layer slows or prevents water and/or oxygen from diffusing into the hygroscopic nonlinear optical crystal, thus simplifying handling, storage and operating environmental requirements. One or multiple additional coating layers may be placed on top of the amorphous layer, with the additional coating layers including conventional optical materials. The thicknesses of the amorphous layer and/or additional layers may be chosen to reduce reflectance of the optical component at one or more specific wavelengths. The coated nonlinear optical crystal is used in an illumination source utilized in a semiconductor inspection system, a metrology system, or a lithography system.

23 Claims, 6 Drawing Sheets

(56) References Cited

U.S. PATENT DOCUMENTS

| | | |
|---|---|---|
| 5,998,313 A | 12/1999 | Sasaki et al. |
| 5,999,310 A | 12/1999 | Shafer et al. |
| 6,297,880 B1 | 10/2001 | Rosencwaig et al. |
| 7,474,461 B2 | 1/2009 | Chuang et al. |
| 7,525,649 B1 | 4/2009 | Leong et al. |
| 7,705,331 B1 | 4/2010 | Kirk et al. |
| 7,817,260 B2 | 10/2010 | Chuang et al. |
| 7,957,066 B2 | 6/2011 | Armstrong et al. |
| 8,873,596 B2 | 10/2014 | Dribinski et al. |
| 9,080,971 B2 | 7/2015 | Kandel et al. |
| 9,097,683 B2 | 8/2015 | Dribinski et al. |
| 9,228,943 B2 | 1/2016 | Wang et al. |
| 9,250,178 B2 | 2/2016 | Chuang et al. |
| 9,255,887 B2 | 2/2016 | Brunner |
| 9,279,774 B2 | 3/2016 | Romanovsky et al. |
| 9,413,134 B2 | 8/2016 | Dribinski et al. |
| 9,459,215 B2 | 10/2016 | Chuang et al. |
| 9,470,639 B1 | 10/2016 | Zhuang et al. |
| 9,645,287 B2 | 5/2017 | Brunner |
| 9,709,510 B2 | 7/2017 | Kolchin et al. |
| 9,723,703 B2 | 8/2017 | Bezel et al. |
| 9,726,617 B2 | 8/2017 | Kolchin et al. |
| 9,865,447 B2 | 1/2018 | Chuang et al. |
| 9,891,177 B2 | 2/2018 | Vazhaeparambil et al. |
| 10,283,366 B2 | 5/2019 | Chuang et al. |
| 10,921,261 B2 | 2/2021 | Chuang et al. |
| 11,360,032 B2 | 6/2022 | Chuang et al. |
| 2005/0008047 A1 | 1/2005 | Hashimoto et al. |
| 2016/0099540 A1* | 4/2016 | Chuang ............... H01S 3/10084 372/5 |
| 2019/0198330 A1 | 6/2019 | Chuang et al. |
| 2021/0131978 A1 | 5/2021 | Chuang et al. |
| 2022/0399694 A1* | 12/2022 | Chuang ................. G02F 1/3551 |
| 2023/0034635 A1* | 2/2023 | Fielden ............. G01N 21/9501 |

OTHER PUBLICATIONS

Search Report and Written Opinion in International Application No. PCT/US2022/038603 dated Nov. 3, 2022.

L. Isaenko et al. "CsLiB6O10 crystals with Cs deficit: structure and properties," J. Crystal Growth, 282, 407-413 (2005).

* cited by examiner

PROTECTIVE COATING FOR NONLINEAR OPTICAL CRYSTAL

CROSS-REFERENCE TO RELATED APPLICATIONS

The present claims the benefit of U.S. Provisional Application No. 63/227,342, filed on Jul. 30, 2021, which is incorporated herein by reference in the entirety.

TECHNICAL FIELD

The present disclosure relates generally to nonlinear optical crystals for use in semiconductor manufacturing (e.g., to inspect and/or measure photomasks, reticles, and semiconductor wafers). In particular, the disclosure relates to a nonlinear optical crystal suitable for generating deep UV wavelengths by harmonic conversion and to optical coating materials and a coating process for protecting the nonlinear optical crystal.

BACKGROUND

The integrated circuit industry requires inspection tools with increasingly higher sensitivity to detect ever smaller defects and particles whose sizes may be a few tens of nanometers (nm), or less. These inspection tools must operate at high speed in order to inspect a large fraction, or even 100%, of the area of a photomask, reticle, or wafer, in a short period of time. For example, inspection time may be one hour or less for inspection during production or, at most, a few hours for R&D or troubleshooting. In order to inspect so quickly, inspection tools use pixel or spot sizes larger than the dimensions of the defect or particle of interest and detect just a small change in signal caused by a defect or particle. Detecting a small change in signal requires a high light level and a low noise level. High speed inspection is most commonly performed in production using inspection tools operating with ultraviolet (UV) light. Inspection in R&D may be performed with UV light or with electrons.

The integrated circuit industry also requires high precision metrology tools for accurately measuring the dimensions of small features down to a few nanometers or less on semiconductor wafers. Metrology processes are performed on wafers at various points in a semiconductor manufacturing process to measure a variety of characteristics of the wafers such as a width of a patterned structure on the wafer, a thickness of a film formed on the wafer, and overlay of patterned structures on one layer of the wafer with respect to patterned structures on another layer of the wafer. These measurements are used to facilitate process controls and/or yield efficiencies in the manufacture of semiconductor dies. Metrology may be performed with visible and UV light or with electrons (as in a scanning electron microscope), but light is generally preferred because high brightness light sources enable faster measurement times and more measurements per wafer compared with electron microscopes.

Optical frequency conversion, such as harmonic generation and frequency summation, is a convenient method of generating short-wavelength DUV and VUV radiation from longer wavelength (such as infrared or green) laser radiation. An appropriate nonlinear optical crystal may be configured to phase match between the input and output wavelengths using known techniques such as critical phase matching, noncritical phase matching and quasi phase matching. Only a few nonlinear optical crystals have the necessary optical properties, including transparency, optical refractive indices, nonlinear coefficients, and damage threshold, to be useful for generating DUV or VUV radiation. The two most used nonlinear optical materials for DUV wavelengths are beta barium borate (BBO) and cesium lithium borate (CLBO). Of these two CLBO has the higher damage threshold making it particularly useful for high powered DUV light sources. CLBO is transparent down to a wavelength of about 184 nm, so CLBO is also useful for generating light at the long wavelength end of the VUV spectrum.

However, CLBO has a disadvantage in that it is very hygroscopic. See, for example, L. Isaenko et al. "CsLiB$_6$O$_{10}$ crystals with Cs deficit: structure and properties," J. Crystal Growth, 282, 407-413 (2005). Immediately upon exposure to the atmosphere, a CLBO crystal begins absorbing moisture. In a few weeks of exposure to air, a crystal can absorb enough moisture that to cause it to crack due to nonuniform expansion. It is well known that CLBO must be kept in a low humidity environment when used as a nonlinear optical element to generate light having a DUV wavelength. Just a few minutes of exposure to air, even when not operating, can result in enough moisture being absorbed that the stability and lifetime of the crystal can be degraded when subsequently exposed to high power densities at DUV wavelengths, although such a crystal may still perform well with lower DUV power intensities. Therefore, it is necessary to maintain the crystal in a very low humidity environment at all times during handling, shipping, manufacturing, and servicing a laser or an instrument that contains such a crystal. For example, a glove box with a controlled, low humidity environment may be needed to protect a crystal during removal from a storage container and installation in a laser. The complete laser may need to be continuously purged by a low humidity gas such as dry air or nitrogen including when not operating and when being shipped from one location to another. This adds significant cost and time to the manufacturing and servicing processes and requires investments in specialized equipment and facilities for shipping and storage of crystals and lasers.

What is therefore needed is a simpler and/or less expensive method of protecting a CLBO crystal that overcomes some, or all, of the limitations of previous approaches.

SUMMARY

A characterization system is disclosed, in accordance with one or more embodiments of the disclosure. In embodiments, the characterization system includes a light source configured to generate incident light having a wavelength in a range between 100 nm and 300 nm; a sensor; and an optical system configured to direct the incident light onto a sample and direct light from the sample to the sensor. In embodiments, the light source includes a nonlinear optical crystal comprising: a substrate comprising a hygroscopic nonlinear optical material and configured to convert incident light having a wavelength longer than 300 nm to output light having a wavelength between 100 nm and 300 nm; and a first amorphous material layer disposed on the substrate, wherein the first amorphous material layer forms a continuous encapsulating structure surrounding an outer surface of the substrate, wherein the first amorphous material layer consists essentially of one or more alkali metal borates.

A characterization system is disclosed, in accordance with one or more additional and/or alternative embodiments of the disclosure. In embodiments, the characterization system includes a light source configured to generate incident light having a wavelength in a range between 100 nm and 300 nm; and an optical system configured to direct said incident light onto a sample. In embodiments, the light source includes at least one nonlinear optical crystal comprising: a substrate comprising a hygroscopic non-linear optical material and configured to convert incident light having a wavelength longer than 300 nm to output light having a wavelength between 100 nm and 300 nm; a first amorphous material layer disposed on the substrate; and a second optical material layer disposed on a top surface of the first amorphous material layer. In embodiments, the first amorphous material layer forms a continuous encapsulating structure that surrounds the outer surface of the substrate, wherein the first amorphous material layer consists essentially of one or more alkali metal borates. In embodiments, the second optical material layer comprises a second optical material having a refractive index that is lower than a refractive index of the amorphous material layer, wherein the first amorphous layer and the second optical material layer are configured such that a portion of the output light passes through both the first and second optical material layers to the top surface of the substrate.

A method of fabricating and coating a nonlinear optical crystal is disclosed, in accordance with one or more embodiments of the present disclosure. In embodiments, the method includes providing a nonlinear optical crystal; annealing the nonlinear optical crystal; placing the nonlinear optical crystal in an inert environment above a liquid; setting the temperature of the liquid to a first desired temperature Tl; setting the temperature of the nonlinear optical crystal to a desired temperature Tc; lowering the nonlinear optical crystal into the liquid; forming an amorphous layer on the nonlinear crystal; and removing the nonlinear optical crystal from the liquid after a predetermined time, wherein the nonlinear optical crystal comprises at least one of a CLBO crystal or a CBO crystal, and the liquid consists essentially of at least one of an alkali metal borate or an alkali earth metal borate.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure

BRIEF DESCRIPTION OF DRAWINGS

The numerous advantages of the disclosure may be better understood by those skilled in the art by reference to the accompanying figures.

DETAILED DESCRIPTION

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to the use of an amorphous alkali metal borate or alkaline earth metal borate coating to slow the absorption of water by CLBO or other borate hygroscopic nonlinear optical crystal, thereby allowing the crystal to be exposed for minutes or hours to environments containing a relative humidity of a few percent or higher. The disclosure is further directed to a method for coating CLBO or other hygroscopic nonlinear optical crystal with an amorphous layer of an alkali metal borate or an alkaline earth metal borate. In one embodiment, the alkali metal borate may consist of one or more of lithium triborate ($LiB_3O_5$, LBO), lithium tetraborate ($Li_2B_4O_7$, LB4), cesium lithium borate ($Cs_2LiB_6O_{10}$, CLBO), cesium triborate ($CsB_3O_5$, CBO), and cesium tetraborate ($Cs_2B_4O_7$, CB4). In another embodiment, the alkaline earth metal borate may consist of strontium tetraborate ($SrB_4O_7$, SBO).

The use of strontium tetraborate as an optical coating is discussed in U.S. Pat. Nos. 10,921,261, issued on Feb. 16, 2021, and No. 11,360,032, issued on Jun. 14, 2022, which are incorporated herein by reference in the entirety.

Figure 1:
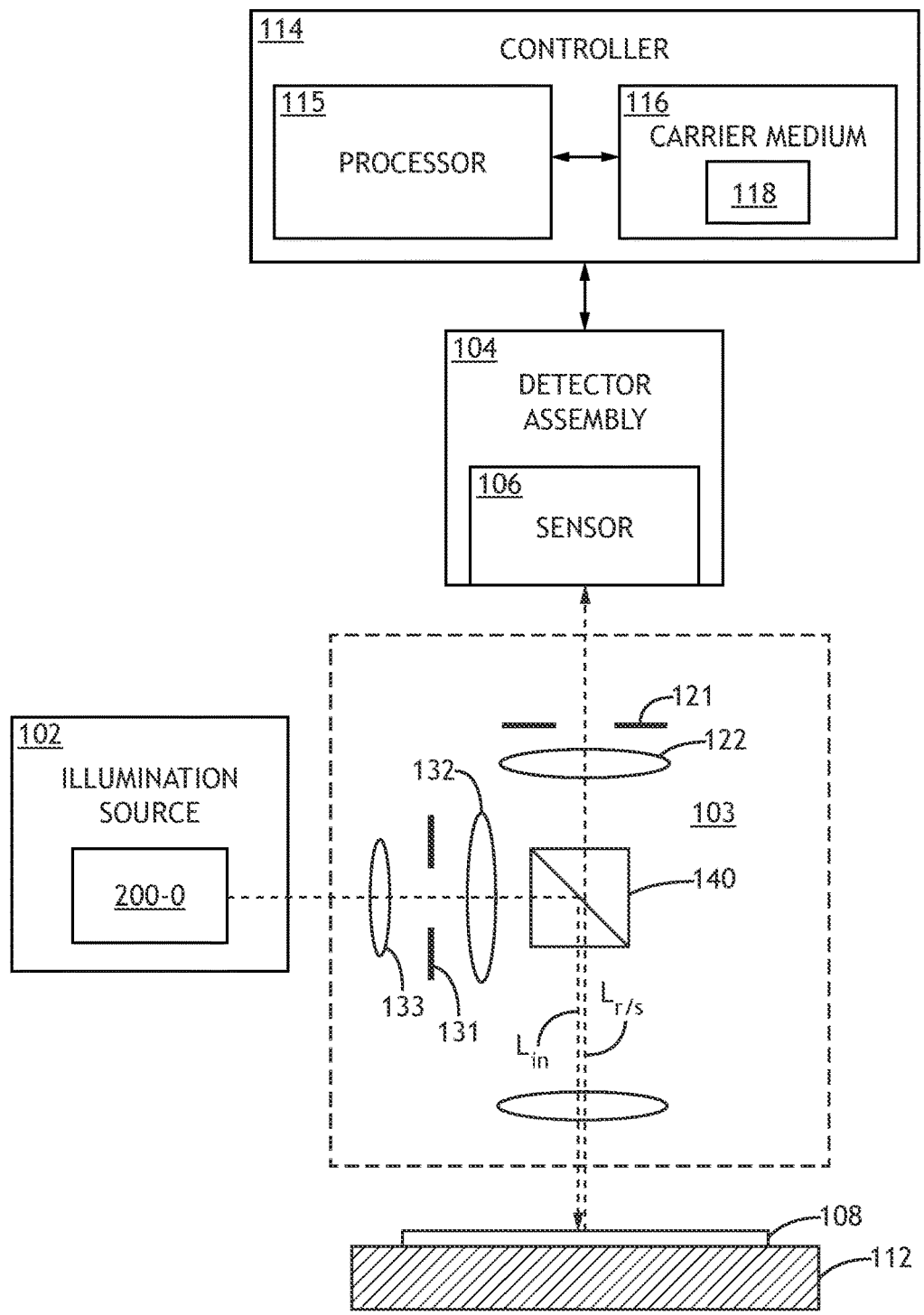
FIG. 1 illustrates a characterization system configured to inspect or measure a semiconductor-fabrication-related sample, in accordance with one or more embodiments of the present disclosure.

FIG. 1 illustrates a characterization system 100 configured to inspect or measure a semiconductor-fabrication-related sample 108, such as a silicon wafer, a reticle, or photomask. The characterization system 100 may comprise an inspection system or a metrology system. System 100 generally includes an illumination (light) source 102, a detector assembly 104 including a sensor 106 and a stage 112.

Illumination source 102 may be configured to generate (emit) deep UV (DUV) and/or vacuum UV (VUV) incident light (radiation) $L_{in}$ having a wavelength in the range of 100 nm to 300 nm but may be configured to generate light having wavelengths longer than 300 nm. In some embodiments, illumination source 102 utilizes one or more lasers and one or more optical components (e.g., a frequency converter 200-0) to generate incident light $L_{in}$. In one embodiment, illumination source 102 may include a continuous source, such as an arc lamp, a laser-pumped plasma light source, or a continuous wave (CW) laser. In another embodiment, illumination source 102 may be a pulsed source, such as a mode-locked laser, a Q-switched laser, or a plasma light source pumped by a mode-locked or Q-switched laser. Suitable light sources that may be included in illumination source 102 are described in U.S. Pat. No. 7,705,331, entitled "Methods and systems for providing illumination of a specimen for a process performed on the specimen", to Kirk et al., U.S. Pat. No. 9,723,703, entitled "System and method for transverse pumping of laser-sustained plasma", to Bezel et al., and U.S. Pat. No. 9,865,447, entitled "High brightness laser-sustained plasma broadband source", to Chuang et al., which are incorporated by reference herein.

Stage 112 is configured to receive sample 108 and to facilitate movement of sample 108 relative to optical system 103 (i.e., such that optical system 103 focuses incident light Lin on different regions of sample 108). Stage 112 may comprise an X-Y stage or an R-θ stage. In one embodiment, stage 112 can adjust the height of sample 108 during inspection to maintain focus. In another embodiment, optics 103 can be adjusted to maintain focus.

Optical system (optics) 103 comprises multiple optical components that are configured to direct and focus incident light $L_{in}$ onto sample 108, and to direct reflected or scattered light $L_{r/s}$ from the sample 108 to sensor 106. For example, the optical components of optical system 103 illustrated in FIG. 1 include, but are not limited to, an illumination tube lens 132, an objective lens 150, a collection tube lens 122, a condensing lens 133 and a beam splitter 140.

During the operation of system 100, incident light $L_{in}$ leaving illumination source 102 is directed by condensing lens 133 and illumination tube lens 132 to beam splitter 140, which directs incident light $L_{in}$ downward through objective lens 150 onto sample 108. Reflected light $L_{r/s}$ represents the portion of incident light $L_{in}$ that is reflected and/or scattered in an upward direction into objective lens 150 by the surface features of sample 108, and is directed by objective lens 150 and collection tube lens 122 to sensor 106. Sensor 106 generates an output signal/data based on the reflected light $L_{r/s}$ received from sample 108. The output of sensor 106 is connect to a controller 114, which analyzes the output. One or more processors 115 of the controller 114 are configured by program instructions 118, which can be stored on a carrier medium 116. In one embodiment, controller 114 controls the characterization system 100 and detector assembly 104 to inspect or measure a structure on sample 108. In one embodiment, system 100 is configured to illuminate a line on sample 108 and to collect reflected/scattered light in one or more dark-field and/or bright-field collection channels. In this embodiment, detector assembly 104 may include a time delay and integration (TDI) sensor, a line sensor or an electron-bombarded line sensor.

In one embodiment, illumination tube lens 132 is configured to image illumination pupil aperture 131 to a pupil stop within objective lens 150 (i.e., illumination tube lens 132 is configured such that the illumination pupil aperture 131 and the pupil stop are conjugate to one another). Illumination pupil aperture 131 may be configurable, for example, by switching different apertures into the location of illumination pupil aperture 131, or by adjusting a diameter or shape of the opening of illumination pupil aperture 131. In this way, sample 108 may be illuminated by different ranges of angles depending on the measurement or inspection being performed under control of controller 114. Although FIG. 1 depicts the illumination as being directed to the sample 108 through the objective lens 150, in some embodiments, the illumination may be directed to the sample 108 outside objective lens 150.

In one embodiment, collection tube lens 122 is configured to image the pupil stop within objective lens 150 to collection pupil aperture 121 (i.e., collection tube lens 122 is configured such that the collection pupil aperture 121 and the pupil stop within objective lens 150 are conjugate to one another). Collection pupil aperture 121 may be configurable, for example, by switching different apertures into the location of collection pupil aperture 121, or by adjusting a diameter or shape of the opening of collection pupil aperture 121. In this way, different ranges of angles of light reflected or scattered from sample 108 may be directed to detector assembly 104 under control of controller 114.

Either, or both, of illumination pupil aperture 131 and collection pupil aperture 121 may comprise a programmable aperture such as one described in U.S. Pat. No. 9,255,887 entitled "2D programmable aperture mechanism" to Brunner, or to one described in U.S. Pat. No. 9,645,287 entitled "Flexible optical aperture mechanisms" to Brunner. Methods of selecting an aperture configuration for wafer inspection are described in U.S. Pat. No. 9,709,510 "Determining a configuration for an optical element positioned in a collection aperture during wafer inspection" to Kolchin et al., and U.S. Pat. No. 9,726,617 "Apparatus and methods for finding a best aperture and mode to enhance defect detection" to Kolchin et al., which are incorporated by reference herein.

In embodiments, at least one borate nonlinear optical component utilized in illumination source 102 includes an amorphous layer formed on multiple surfaces of the substrate structure of the component. The amorphous layer consists essentially of an alkali metal borate, a mixture of alkaline metal borates or an alkaline earth metal borate. In one embodiment, frequency converter 200-0 of illumination source 102 may include a lithium triborate or cesium lithium borate amorphous material layer. In another embodiment, frequency converter 200-0 of illumination source 102 may include an alkali metal borate material layer that forms a continuous encapsulating structure that entirely surrounds a substrate structure of the nonlinear optical component. This structure is described in additional detail with reference to FIGS. 2A and 2B. The lifetime of the borate nonlinear optical component may be improved by the amorphous layer because the amorphous layer slows the penetration of water and/or oxygen into the borate nonlinear optical crystal. The process of manufacturing, servicing, shipping and storing system 100 and/or illumination source 102 may be simplified or made less expensive by using the amorphous layer to protect a borate nonlinear optical component in frequency converter 200-0.

Additional details of various embodiments of inspection or metrology system 100 are described in U.S. Pat. No. 9,891,177, entitled "TDI Sensor in a Darkfield System", to Vazhaeparambil et al., U.S. Pat. No. 9,279,774, entitled "Wafer inspection", to Romanovsky et al., U.S. Pat. No. 7,957,066, entitled "Split field inspection system using small catadioptric objectives", to Armstrong et al., U.S. Pat. No. 7,817,260, entitled "Beam delivery system for laser darkfield illumination in a catadioptric optical system", to Chuang et al., U.S. Pat. No. 5,999,310, entitled "Ultra-broadband UV microscope imaging system with wide range zoom capability", to Shafer et al., U.S. Pat. No. 7,525,649, entitled "Surface inspection system using laser line illumination with two dimensional imaging", to Leong et al., U.S. Pat. No. 9,080,971, entitled "Metrology systems and methods", to Kandel et al., U.S. Pat. No. 7,474,461, entitled "Broad band objective having improved lateral color performance", to Chuang et al., U.S. Pat. No. 9,470,639, entitled "Optical metrology with reduced sensitivity to grating anomalies", to Zhuang et al., U.S. Pat. No. 9,228,943, entitled "Dynamically Adjustable Semiconductor Metrology System", to Wang et al., U.S. Pat. No. 5,608,526, entitled "Focused Beam Spectroscopic Ellipsometry Method and System", to Piwonka-Corle et al., issued on Mar. 4, 1997, and U.S. Pat. No. 6,297,880, entitled "Apparatus for Analysing Multi-Layer Thin Film Stacks on Semiconductors", to Rosencwaig et al., issued on Oct. 2, 2001, which are incorporated by reference herein.

Figure 2A:
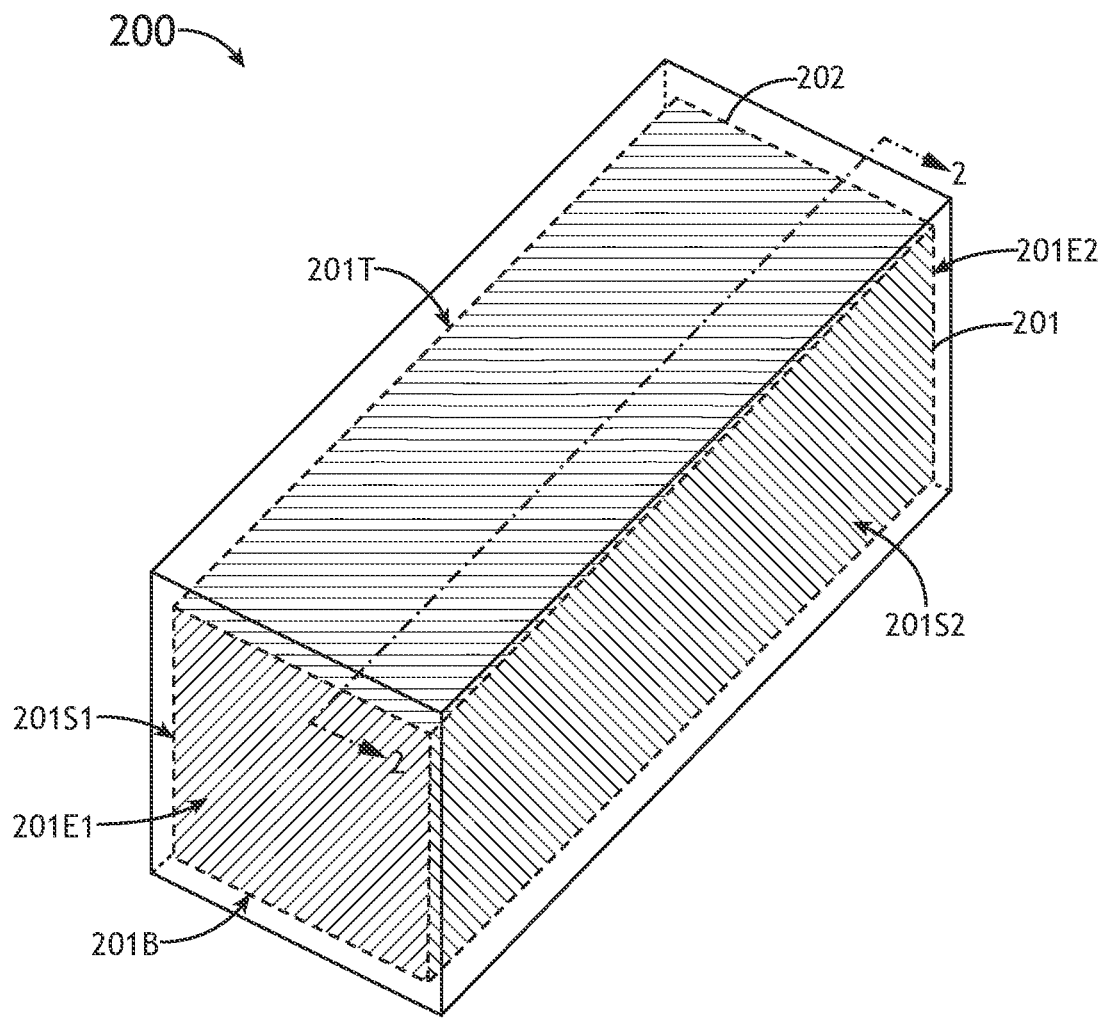
FIGS. 2A-2C illustrate an optical component having a borate nonlinear optical crystal coated with layer of amorphous material, in accordance with one or more embodiments of the present disclosure.
Figure 2B:
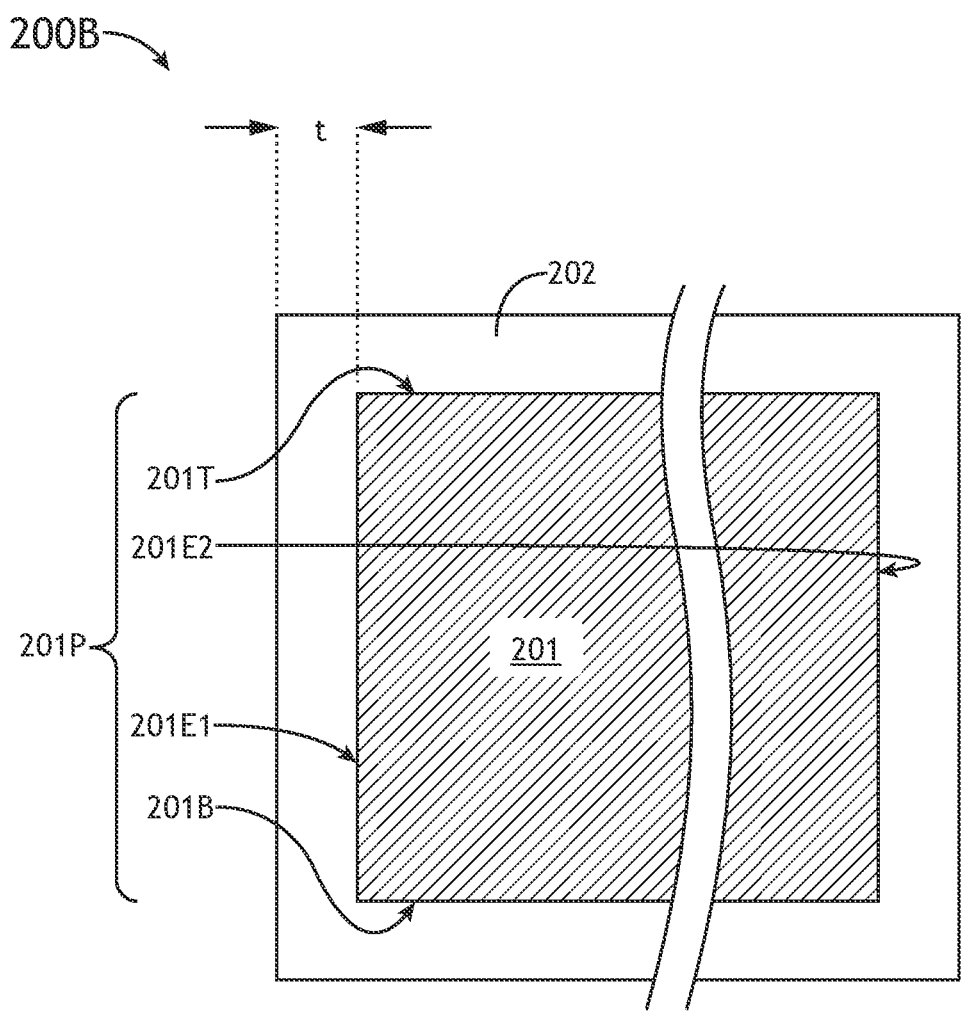
Figure 2C:
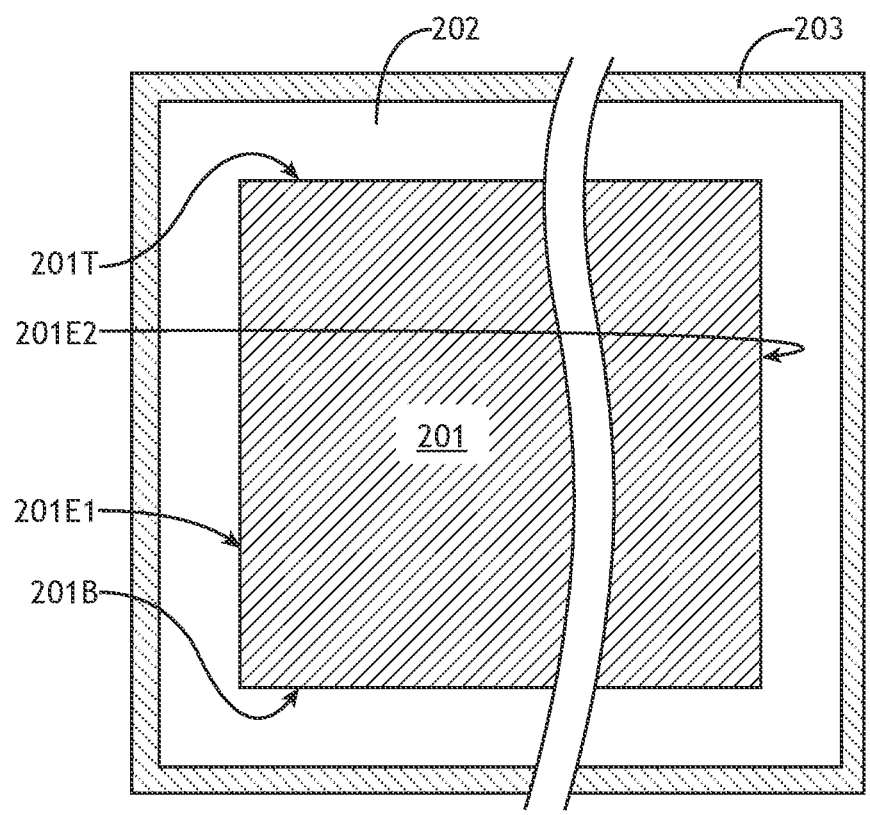

FIGS. 2A-2C illustrate an optical component 200 having a borate nonlinear optical crystal (substrate) 201 coated with layer of amorphous material (sometimes referred to herein as an amorphous layer or an amorphous coating) over its entire outer peripheral surface. FIG. 2A shows a perspective view of the optical component, and FIG. 2B shows a lengthwise cross section 200A corresponding to 2-2 in FIG. 2A through that optical component. FIG. 2C shows a lengthwise cross section 200C of an embodiment in which one or more additional layers are coated on top of (outside of) the layer of amorphous material. In an embodiment of characterization system 100 shown in FIG. 1, illumination source 102 includes a laser that generates a deep UV wavelength such as a wavelength shorter than 300 nm. For example, illumination source 102 may include a laser configured to generate a wavelength close to 266 nm by generating a fourth harmonic of approximately 1064 nm wavelength light generated by a solid-state or fiber laser. The laser may generate a second harmonic of the 1064 nm light by using an appropriately configured lithium triborate (LBO) crystal. LBO is not hygroscopic and may be operated in air, even when laser power levels of tens of Watts or higher are used. The fourth harmonic may be generated using a CLBO crystal configured to double the frequency of the second harmonic light. CLBO is hygroscopic and must be kept in a very low humidity environment at all times, whether the laser is operating or not. For high power operation, such as a fourth harmonic power of about 10 W or higher, it may be desirable to lower the oxygen level of the environment of the crystal well below that of the atmosphere to minimize surface damage to the crystal. By way of other examples, illumination source 102 may include a laser configured to generate a wavelength close to 213 nm or close to 193 nm by using harmonic generation and frequency summation in multiple non-linear optical crystals, as represented by frequency conversion crystal (optical component) 200-0. CLBO and CBO are the most useful materials for frequency conversion at such wavelengths, but both materials are hygroscopic. FIGS. 2A-2C illustrate a frequency conversion crystal 200 comprising a substrate 201 consisting of one of CLBO or CBO and configured to generate a deep UV wavelength, for example configured to double the frequency of light having a wavelength near 532 nm, or configured to sum the frequencies of light having wavelengths near 266 nm and near 1064 nm to generate light having a wavelength near 213 nm.

As shown in FIGS. 2A-2C, an entire peripheral surface of non-linear crystal (e.g., CLBO or CBO) substrate 201 is covered (e.g., encapsulated) by an amorphous layer 202 consisting essentially of one or more of an alkali metal borate, an alkali earth metal borate or a mixture thereof. In the depicted example, crystal substrate 201 has a rectangular prism (e.g., cuboid) shape with opposing top and bottom surfaces 201T and 201B, opposing side surfaces 201SI and 201S2, and opposing end surfaces 201E1 and 201E2, which respectively form light input and light output surfaces of frequency conversion crystal 200. In this example, amorphous layer 202 includes an unbroken cuboid structure having portions that extend over all six surfaces 201T, 201B, 201S1, 201S2, 201E1 and 201E2. FIG. 2A shows a cross section 200A through an exemplary frequency conversion crystal in which amorphous layer 202 forms a single-layer coating directly on the peripheral surface (e.g., top and bottom surfaces 201T and 201B and end surfaces 201E1 and 201E2) of substrate 201. In other embodiments, the amorphous layer may be part of a multi-layer encapsulating structure including one or more conventional optical material layers 203 disposed on (i.e., outside) the amorphous layer as illustrated in FIG. 2C. In each embodiment, the thickness of amorphous layer 202 is chosen to slow or prevent at least water from penetrating into crystal substrate 201. The thickness of amorphous layer 202 may be approximately 10 nm or thicker, or approximately 100 nm. The thickness of amorphous layer 202 need not be uniform as long as it is sufficiently thick to slow or prevent diffusion of at least water, and as long as the layer is free of pinholes. The thicknesses of the amorphous layer on input surface 201E1 and output surface 201E2 may be further chosen to reduce reflectivity of one or more wavelengths used or generated in the frequency conversion by, for example, setting the thickness (as measured in a light propagation direction) to be approximately equal to an odd number of quarter wavelengths of a wavelength used or generated in the frequency conversion if the refractive index of the amorphous layer 202 is lower than that of the substrate 201. In another example, if the refractive index of the amorphous layer 202 is higher than that of the substrate 201, then the reflectivity may be set to be approximately equal to an odd number of half wavelengths of a wavelength used or generated in the frequency conversion. In the embodiment illustrated in FIG. 2C, the thicknesses and refractive indices of the one or more conventional optical material layers 203 may be chosen to further reduce the reflectivity at a wavelength of interest. The uniformity of the coatings on end surfaces 201E1 and 201E2 may be controlled to avoid too much variability in a selected optical property, such as a reflectivity, of those surfaces. Even if the amorphous coating is not completely impervious to water and oxygen, if it slows diffusion of these molecules sufficiently, it may allow storage and/or operation of a hygroscopic non-linear crystal in an environment with higher water and oxygen content than an uncoated crystal, and thereby reducing storage and operating costs.

Amorphous layer 202 essentially consists of one or more alkali metal borates, alkali earth metal borates, or a mixture thereof. Exemplary materials used in amorphous layer 202 include lithium triborate ($LiB_3O_5$, LBO), lithium tetraborate ($Li_2B_4O_7$, LB4), cesium lithium borate ($CsLiB_6O_{10}$, CLBO), cesium triborate ($CsB_3O_5$, CBO), cesium tetraborate ($Cs_2B_4O_7$, CB4) and strontium tetraborate ($SrB_4O_7$, SBO). Borate materials adhere strongly to one another because of their similar chemical compositions, and therefore a borate coating can be more impervious to penetration of water and/or oxygen than a coating of a conventional optical material, such as $SiO_2$, when coated onto a borate substrate. In a first embodiment, amorphous layer 202 consists of essentially LBO. LBO is not hygroscopic and has good light transmission over a wavelength range spanning from about 2.6 μm in the infrared (IR) to about 160 nm in the VUV. LBO can effectively seal a hygroscopic crystal from the environment while transmitting wavelengths of most importance in semiconductor inspection and metrology applications. In a second embodiment, amorphous layer 202 consists of essentially CLBO. Although amorphous CLBO may be slightly hygroscopic, it is less permeable to water and/or oxygen than crystalline CLBO because of its amorphous structure, and so may relax the environmental requirements for storage and/or operation of a nonlinear optical crystal. For example, storage in an environment of about 1% or about 0.1% humidity may be possible for a CLBO nonlinear optical crystal with an amorphous CLBO coating, whereas much lower humidity is required for storage of an uncoated CLBO crystal. In one embodiment, amorphous layer 202 may consist essentially of a mixture of alkali metal borates and/or alkali earth metal borates, such as a mixture of two or more of the above-mentioned alkali metal borates and alkali earth metal borates. It is to be understood that amorphous layer 202 may include some crystalline or polycrystalline alkali metal borate and/or alkali earth metal borate material particularly on the non-optical surfaces such as 201T, 201B, 201S1 and 201S2. Since the boundaries between crystals in a polycrystalline material can scatter light, in an embodiment, any polycrystalline regions of amorphous layer 202 on surfaces 201E1 and 201E2 are kept to about 10% or less of the surface areas of those surfaces.

The amorphous layer 202 may be applied to substrate 201 by dipping the crystal in a bath containing the material of the amorphous layer in a molten state or in solution as explained below in relation to FIG. 3. Alternatively, the amorphous layer 202 may be applied to substrate 201 by sputtering, evaporation, or other known coating technique. In the embodiment illustrated in FIG. 2C, the one or more optical material layers 203 may be applied to layer 202 by sputtering, evaporation, or other known coating technique.

Figure 3:
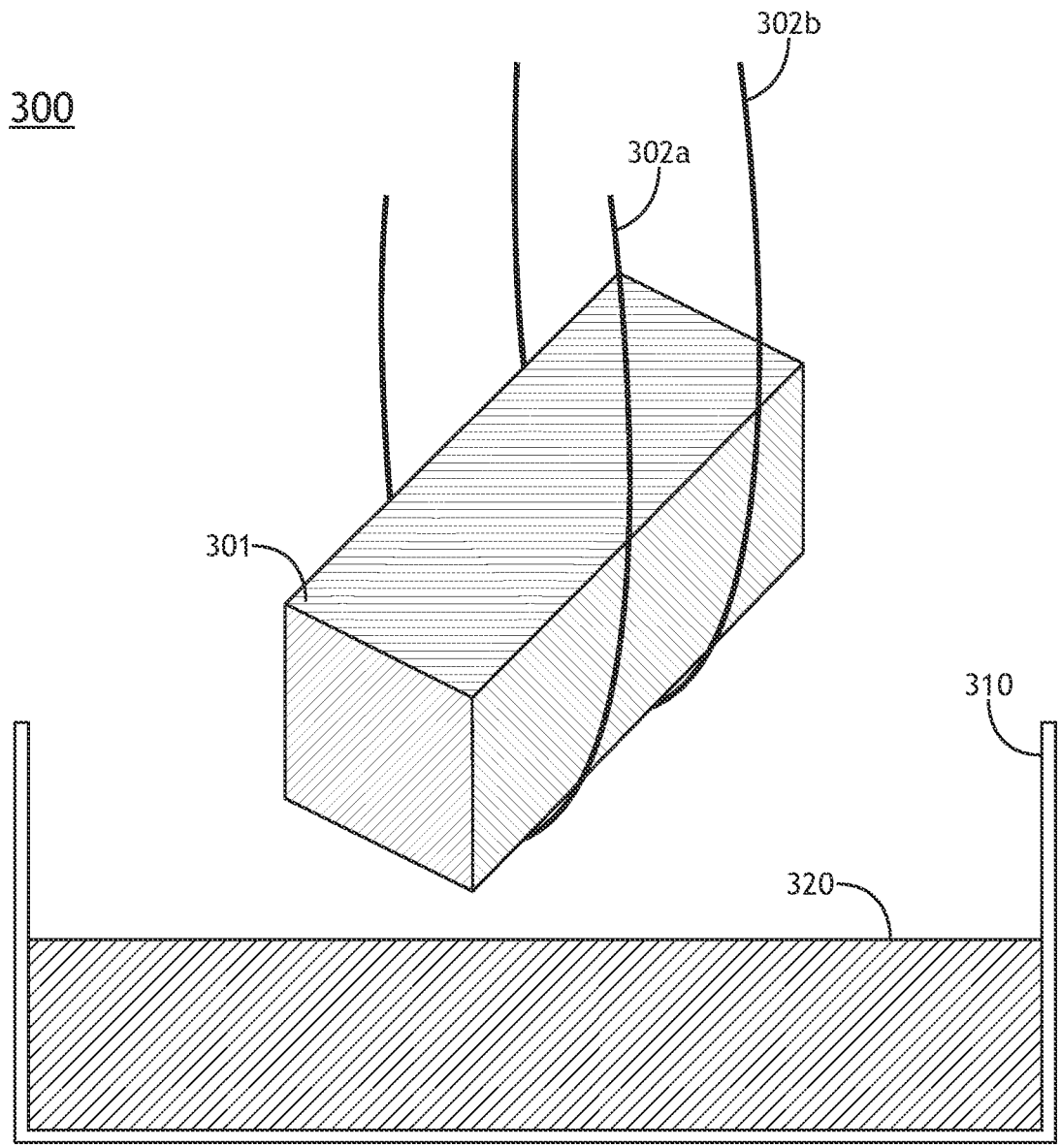
FIG. 3 illustrates an apparatus for applying coating amorphous layer onto a substrate, in accordance with one or more embodiments of the present disclosure.

FIG. 3 illustrates an apparatus for applying coating amorphous layer 202 onto substrate 201, in accordance with one or more embodiments of the present disclosure. In embodiments, nonlinear optical crystal substrate 301 (e.g., substrate 201 in FIG. 2) is supported by two or more wires 302A and 302B which pass underneath the substrate 301. Wires 302A and 302B may be fabricated from an inert, high melting point material, such as platinum. In an alternative embodiment (not shown), substrate 301 is supported by a wire mesh instead of wires 302A and 302B. In embodiments, crucible 310 contains liquid 320 which includes a material to be coated onto substrate 301. For example, liquid 320 may include the same alkali metal borate, alkali earth metal borate or mixture thereof as an intended composition of the amorphous layer. In embodiments, liquid 320 consists of the material for the amorphous layer in a molten state. In another embodiment, the composition of liquid 320 may differ from that of the amorphous layer. For example, liquid 320 may contain more or less of one component, such as boron, than the intended composition of the amorphous layer. In another example, liquid 320 may include an additional component that is not present in the amorphous layer. The composition of liquid 320 may be chosen to modify a physical property such as viscosity, or to modify a chemical property, such as eliminating OH from the liquid. Crucible 310 may be fabricated from an inert, high melting-point material such as platinum.

In one embodiment, liquid 320 is held at a temperature close to the melting point of the material of the amorphous layer, such as within ±5° C. of the melting point. Substrate 301 may be preheated to a temperature just below the melting point of the material of the amorphous layer, such as a temperature of about 5° C. or about 10° C. below the melting material. Then the substrate 301 may be lowered into the liquid 320. Because of the temperature of the substrate 301, material will start to deposit on substrate 301. The rate of deposition can be controlled by the initial temperature of substrate 301 and by the temperature of liquid 320. The temperature of liquid 320 may be further adjusted after substrate 301 has been lowered into liquid 320 to achieve or maintain a desired growth rate of the amorphous layer. After a predetermined time to allow the amorphous layer to grow to a desired thickness, the substrate 301 is lifted out of liquid 320, for example, by raising wires 302A and 302B.

Since crystal substrate 301 must be held during the coating process (such as by wires 302A and 302B), in one embodiment, two coating operations are used to coat the entire surface wherein prior to the second coating operation, the wires are moved relative to substrate 301 such that the locations on substrate 301 touched by the wires 302A and 302B during the first coating operation are exposed during the second coating operation. The total time of the two coating operations is chosen so that the resulting thickness of the amorphous layer created on the optical faces (e.g., 201E1 and 201E2 depicted in FIGS. 2A-2C) is the desired thickness.

Figure 4:
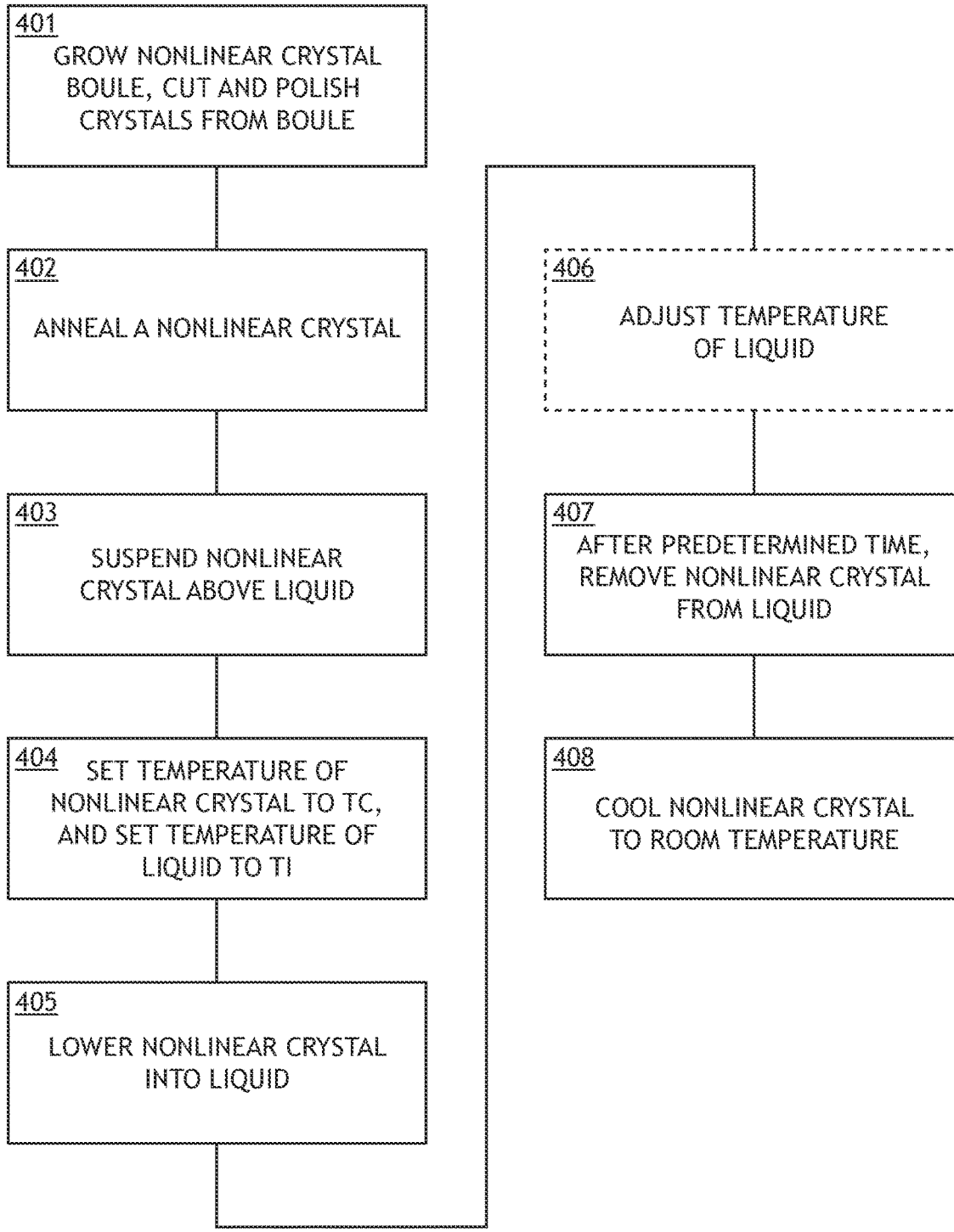
FIG. 4 illustrates a flow diagram depicting a method of fabricating and coating a nonlinear optical crystal, in accordance with one or more embodiments of the present disclosure.

FIG. 4 illustrates a flow diagram depicting a method 400 of fabricating and coating a nonlinear optical crystal, in accordance with one or more embodiments of the present disclosure. In Step 401, a boule of the nonlinear optical crystal is grown, for example, by a known crystal-growing technique such as the Czochralski method or the Kyropolous method. One or more nonlinear optical crystals are cut from the boule in a desired shape, size, and orientation relative to the crystal axes for the intended frequency conversion application. The optical surfaces (for example 201E1 and 201E2 shown in FIGS. 2A and 2B) of the one or more nonlinear optical crystals are polished to a desired smoothness to minimize scattering of light from those surfaces. The polishing process typically involves more than one polishing step such as, for example, a coarse polishing step followed by a fine polishing step. Although the boule is grown in an inert, very low humidity environment or in a vacuum, the subsequent cutting and polishing steps may be done in an environment of a few percent humidity. Since it may take many hours to complete these steps, the one or more nonlinear optical crystals will typically absorb some moisture. Step 401 may include annealing the one or more nonlinear optical crystals part way through the process in order to remove at least some moisture absorbed during the cutting and polishing steps. For example, an annealing step may be performed between completing a coarse polishing step and starting a fine polishing step.

In Step 402, at least one of the one or more polished nonlinear optical crystal from Step 401 is annealed to reduce its moisture content and/or reduce the number of defects in the crystal. Exemplary annealing processes are described in U.S. Pat. Nos. 8,873,596 and 9,097,683, both entitled "Laser with high quality, stable output beam, and long life high conversion efficiency non-linear crystal," and both to Dribinski et al., U.S. Pat. No. 9,413,134, entitled "Multi-stage ramp-up annealing for frequency-conversion crystals," to Dribinski et al., and U.S. Pat. Nos. 9,250,178, 9,459,215 and 10,283,366, all entitled "Passivation of nonlinear optical crystals," to Chuang et al., which are incorporated herein by reference.

In Step 403, the at least one annealed nonlinear optical crystal is suspended in a dry environment (e.g., an environment containing only dry, inert gasses such as argon, or a vacuum environment) over a vat containing a liquid, for example as illustrated in FIG. 3. In embodiments, the time between Steps 402 and 403 is kept to a minimum in order to minimize any moisture absorbed by the nonlinear crystal after the annealing process. In embodiments, the at least one nonlinear optical crystal is kept in a dry, inert environment while being moved from Step 402 to Step 403 or stored between steps. The humidity of such environment may be less than 0.1% or preferably less than 0.01%.

In Step 404, the temperature of the at least one nonlinear optical crystal is set to a value of Tc and the temperature of the liquid is set to a value of $T_L$. In embodiments, Tc is a few ° C. below a melting point of an amorphous layer to be coated on the nonlinear crystal. For example, Tc may be approximately 1° C. below the melting point, between about 1° C. and 5° C. below the melting point, or between about 5° C. and 10° C. below the melting point. In embodiments, Tc is a few ° C. above the melting point of the amorphous layer. For example, Tc may be approximately 1° C. above the melting point, between about 1° C. and 5° C. above the melting point. In one embodiment, $T_L$ is a few ° C. above the melting point of the amorphous layer. For example, $T_L$ may be approximately 1° C. above the melting point, or between about 1° C. and 5° C. above the melting point. In another embodiment, $T_L$ is a few ° C. below the melting point of the amorphous layer. For example, $T_L$ may be approximately 1° C. below the melting point of the amorphous layer.

In Step 405, the at least one nonlinear optical crystal is lowered into the liquid in order to initiate growth of the amorphous layer.

In optional Step 406, the temperature of the liquid is adjusted to control the growth rate of the amorphous layer on the at least one nonlinear crystal. In embodiments, the temperature of the liquid is lowered to a temperature just below the melting point, for example approximately 1° C. below the melting point, between about 1° C. and 5° C. below the melting point, or between about 5° C. and 10° C. below the melting point. If the temperature $T_L$ set in Step 405 is sufficient to achieve and maintain the desired growth rate, then Step 406 may be omitted.

In Step 407, after a predetermined time the at least one nonlinear optical crystal is removed from the liquid. The predetermined time is chosen to achieve a desired thickness of the amorphous layer on the at least one nonlinear optical crystal.

In Step 408, the at least one coated nonlinear optical crystal is cooled to room temperature.

Note that FIG. 4 is meant to illustrate important key steps in the coating process. Many variations including adding steps, combining steps, omitting steps and reordering steps can produce a similar result and are within the scope of the present disclosure. The time duration of each step and any time interval between one step and the next may be adjusted to achieve the desired results. Nonlinear optical crystals may be processed one at a time, or in a batch where multiple crystals are processed substantially simultaneously at each step.

Although it is expected that the coating materials and processes disclosed herein will be particularly useful in semiconductor inspection and metrology systems, it is also envisioned that these coatings and materials may be useful in other applications where VUV and DUV radiation are present, such as in an optical lithography system, and where high-intensity visible or IR radiation is present, such as in an IR system.

The coating material and methods described herein are not intended to be limited to the particular embodiments shown and described but are to be accorded the widest scope consistent with the principles and novel features herein disclosed. Hence, the present disclosure is deemed limited only by the appended claims and the reasonable interpretation thereof.

One skilled in the art will recognize that the herein described components operations, devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components, operations, devices, and objects should not be taken as limiting.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The description is presented to enable one of ordinary skill in the art to make and use the disclosure as provided in the context of a particular application and its requirements. As used herein, directional terms such as "top," "bottom," "over," "under," "upper," "upward," "lower," "down," and "downward" are intended to provide relative positions for purposes of description and are not intended to designate an absolute frame of reference. Various modifications to the preferred embodiment will be apparent to those with skill in the art, and the general principles defined herein may be applied to other embodiments. Therefore, the present disclosure is not intended to be limited to the particular embodiments shown and described but is to be accorded the widest scope consistent with the principles and novel features herein disclosed.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A system including:
   a light source configured to generate incident light having a wavelength in a range between 100 nm and 300 nm;
   a sensor; and
   an optical system configured to direct the incident light onto a sample and direct light from the sample to the sensor,
   wherein the light source includes a nonlinear optical crystal comprising:
      a substrate comprising a hygroscopic nonlinear optical material and configured to convert incident light having a wavelength longer than 300 nm to output light having a wavelength between 100 nm and 300 nm; and
      a first amorphous material layer disposed on the substrate,
      wherein the first amorphous material layer forms a continuous encapsulating structure surrounding an outer surface of the substrate,
      wherein the first amorphous material layer consists essentially of one or more alkali metal borates.

2. The system of claim 1, wherein the hygroscopic nonlinear optical material comprises at least one of a cesium lithium borate (CLBO) crystal or a cesium triborate (CBO) crystal.

3. The system of claim 1, wherein the one or more alkali metal borates include at least one of lithium triborate (LBO), lithium tetraborate (LB4), cesium lithium borate (CLBO), cesium triborate (CBO), or cesium tetraborate (CB4).

4. The system of any of claim 1, wherein the first amorphous material layer is configured to minimize a reflectivity of at least one face of the nonlinear optical crystal at one or more of the wavelength of the incident light or the wavelength of the output light.

5. The system of claim 1, wherein the first amorphous material layer has a thickness in a range between 30 nm and 200 nm.

6. The system of claim 1, wherein the first amorphous material layer is formed directly on a surface of the substrate.

7. The system of claim 1, wherein the light source further comprises: at least one optical material layer disposed over the first amorphous material layer, wherein the first amorphous layer and the at least one optical material layer are configured such that at least one of the incident light and the output light passes through the first amorphous material layer, the at least one optical material layer, and the surface of the substrate.

8. The system of claim 7, wherein the at least one optical material layer comprises an optical material having a refractive index that is lower than a refractive index of the amorphous material layer.

9. The system of claim 7, wherein said at least one optical material layer comprises at least one of magnesium fluoride, calcium fluoride, aluminum fluoride and silicon dioxide.

10. The system of claim 1, wherein the system comprises at least one of a semiconductor inspection system or a semiconductor metrology system.

11. The system of claim 1, wherein the system comprises a lithographic system, the system being configured to expose a pattern on the sample.

12. A system including:
    a light source configured to generate incident light having a wavelength in a range between 100 nm and 300 nm; and
    an optical system configured to direct said incident light onto a sample,
    wherein the light source includes at least one nonlinear optical crystal comprising:
       a substrate comprising a hygroscopic non-linear optical material and configured to convert incident light having a wavelength longer than 300 nm to output light having a wavelength between 100 nm and 300 nm;
       a first amorphous material layer disposed on the substrate; and
       a second optical material layer disposed on a top surface of the first amorphous material layer,
       wherein the first amorphous material layer forms a continuous encapsulating structure that surrounds the outer surface of the substrate,
       wherein the first amorphous material layer consists essentially of one or more alkali metal borates,
       wherein the second optical material layer comprises a second optical material having a refractive index that is lower than a refractive index of the amorphous material layer,
       wherein the first amorphous layer and the second optical material layer are configured such that a portion of the output light passes through both the first and second optical material layers to the top surface of the substrate.

13. The system of claim 12, wherein the system comprises at least one of a semiconductor inspection system or a semiconductor metrology system.

14. The system of claim 12, wherein the system comprises a lithographic system, the system being configured to expose a pattern on the sample.

15. A crystal assembly comprising:
    a nonlinear optical crystal comprising a substrate comprising a hygroscopic nonlinear optical material and configured to convert incident light having a wavelength longer than 300 nm to output light having a wavelength between 100 nm and 300 nm; and
    a first amorphous material layer disposed on the substrate of the nonlinear optical crystal,
    wherein the first amorphous material layer forms a continuous encapsulating structure surrounding an outer surface of the substrate,
    wherein the first amorphous material layer consists essentially of one or more alkali metal borates.

16. A crystal assembly comprising:
    a nonlinear optical crystal comprising a substrate comprising a hygroscopic non-linear optical material and configured to convert incident light having a wavelength longer than 300 nm to output light having a wavelength between 100 nm and 300 nm;
    a first amorphous material layer disposed on the substrate; and a second optical material layer disposed on a top surface of the first amorphous material layer, wherein the first amorphous material layer forms a continuous encapsulating structure that surrounds the outer surface of the substrate, wherein the first amorphous material layer consists essentially of one or more alkali metal borates, wherein the second optical material layer comprises a second optical material having a refractive index that is lower than a refractive index of the amorphous material layer, wherein the first amorphous layer and the second optical material layer are configured such that a portion of the output light passes through both the first and second optical material layers to the top surface of the substrate.

17. A method comprising:
providing a nonlinear optical crystal;
annealing the nonlinear optical crystal;
placing the nonlinear optical crystal in an inert environment above a liquid;
setting the temperature of the liquid to a first desired temperature Tl;
setting the temperature of the nonlinear optical crystal to a desired temperature Tc;
lowering the nonlinear optical crystal into the liquid;
forming an amorphous layer on the nonlinear crystal; and
removing the nonlinear optical crystal from the liquid after a predetermined time, wherein the nonlinear optical crystal comprises at least one of a CLBO crystal or a CBO crystal, and the liquid consists essentially of at least one of an alkali metal borate or an alkali earth metal borate.

18. The method of claim 17, wherein the predetermined time is chosen to result in a thickness of the amorphous layer that reduces the reflectivity of the nonlinear crystal at a selected wavelength.

19. The method of claim 18, wherein the selected wavelength is between 130 nm and 550 nm.

20. The method of claim 18, wherein the thickness is in the range of 30 nm to 200 nm.

21. The method of claim 17, further comprising adjusting the temperature of the liquid after lowering the nonlinear optical crystal into the liquid.

22. The method of claim 17, further comprising a second coating step, the second coating step comprising forming a second layer on the amorphous layer.

23. The method of claim 22, wherein the second layer comprises at least one of magnesium fluoride, calcium fluoride, aluminum fluoride or silicon dioxide.

* * * * *